(12) United States Patent
Xu et al.

(10) Patent No.: US 11,108,276 B2
(45) Date of Patent: Aug. 31, 2021

(54) HIGH-PERFORMANCE SHIELDING SHEET AND PREPARATION METHOD THEREOF AND COIL MODULE COMPRISING THE SAME

(71) Applicant: SUNLINE PRINTING (SHANGHAI) ELECTRONICS CO., LTD., Shanghai (CN)

(72) Inventors: Kexin Xu, Shanghai (CN); Tao Lin, Shanghai (CN); Changhe Wu, Shanghai (CN); Jin Wang, Shanghai (CN); Qingwen Guo, Shanghai (CN); Huixin Hu, Shanghai (CN); Fei Ma, Shanghai (CN); Xu Yang, Shanghai (CN); Yunfang Huo, Shanghai (CN); Jianghua Qian, Shanghai (CN)

(73) Assignee: SUNLINE PRINTING (SHANGHAI) ELECTRONICS CO., LTD., Shanghai (CN)

( * ) Notice: Subject to any disclaimer, the term of this patent is extended or adjusted under 35 U.S.C. 154(b) by 594 days.

(21) Appl. No.: 16/147,431

(22) Filed: Sep. 28, 2018

(65) Prior Publication Data
US 2020/0059118 A1 Feb. 20, 2020

(51) Int. Cl.
*H02J 50/70* (2016.01)
*H02J 50/12* (2016.01)
(Continued)

(52) U.S. Cl.
CPC ......... *H02J 50/70* (2016.02); *H01F 27/2885* (2013.01); *H01F 27/36* (2013.01); *H02J 50/12* (2016.02); *H05K 9/0075* (2013.01)

(58) Field of Classification Search
CPC ....... H02J 50/70; H02J 50/12; H01F 27/2885; H01F 27/36; H05K 9/0075
(Continued)

(56) References Cited

U.S. PATENT DOCUMENTS

| 2015/0302984 A1* | 10/2015 | Kurs | H02J 5/005 |
| | | | 307/104 |
| 2015/0364244 A1* | 12/2015 | Tsai | H01F 27/36 |
| | | | 336/200 |

(Continued)

*Primary Examiner* — Alfonso Perez Borroto
(74) *Attorney, Agent, or Firm* — Steven M. Greenberg, Esq.; Shutts & Bowen LLP

(57) ABSTRACT

The invention relates to a high-performance shielding sheet, preparation method thereof and coil module comprising the same. The high-performance shielding sheet includes at least one sheet which include: at least one shielding layer with low coercive force and low remanence formed of a soft magnetic material; and at least one adhesive layer disposed on at least one side of the shielding layer; and wherein the shielding layer includes a plurality of graphical slits, and the plurality of graphical slits divide the shielding layer into a plurality of graphical fragments; and wherein the plurality of graphical slits are filled with the adhesive layer, enabling the plurality of graphical fragments to be separated from each other and have a good insulation property. The advantages include: improving the electric charging conversion rate, increasing the charging efficiency, reducing the transmission loss, and increasing the uniformity of the electromagnetic wave transmission medium.

33 Claims, 4 Drawing Sheets

(51) Int. Cl.
*H01F 27/28* (2006.01)
*H01F 27/36* (2006.01)
*H05K 9/00* (2006.01)

(58) Field of Classification Search
USPC ......................................................... 174/377
See application file for complete search history.

(56) References Cited

U.S. PATENT DOCUMENTS

| | | | |
|---|---|---|---|
| 2016/0126009 A1* | 5/2016 | Chien | H01F 27/2804 |
| | | | 336/200 |
| 2017/0133145 A1* | 5/2017 | Hong | H01F 27/2804 |
| 2017/0178802 A1* | 6/2017 | Yang | H02J 50/10 |
| 2017/0345548 A1* | 11/2017 | Yu | H01F 27/2804 |
| 2017/0345555 A1* | 11/2017 | Jang | H02J 50/10 |
| 2018/0090991 A1* | 3/2018 | Jol | H01F 38/14 |

* cited by examiner

HIGH-PERFORMANCE SHIELDING SHEET AND PREPARATION METHOD THEREOF AND COIL MODULE COMPRISING THE SAME

CROSS-REFERENCE TO RELATED APPLICATIONS

This application is related to and claims priority to Chinese Patent Application Serial Number 201810941671.6, filed Aug. 17, 2018, and entitled HIGH-PERFORMANCE SHIELDING SHEET AND PREPARATION METHOD THEREOF AND COIL MODULE COMPRISING THE SAME, the entirety of which is incorporated herein by reference.

BACKGROUND OF THE INVENTION

Field of the Invention

The invention relates to the field of manufacturing of electronic communication equipment, and more particularly to an application of a high-performance shielding sheet and a coil module comprising the same, and in particular, to a shielding sheet applicable to wireless charging and near field communication.

Description of the Related Art

With the rapid development of communication technology and electronic technology, various intelligent terminals, such as mobile phones, have the functions of wireless charging and fast payment; have become lighter and thinner than ever before; and have become more diversified in functions for meeting consumers' different demands. Accordingly, these types of intelligent terminals have become popular among consumers.

Presently, smart phones generally use amorphous/nanocrystalline shielding sheets as magnetic shielding sheets, which is an integrated solution for magnetic shielding, aiming at integrating functions such as Wireless Charging and Near Field Communication (NFC) on a Flexible Printed Circuit (FPC). In this way, space can be saved and thickness can be reduced.

The working principle of wireless charging technology is based on the principle of magnetic field coupling, which is similar to the working principle of conventional resonant switching power supply. Magnetic field coupling technology is less difficult to implement and has obvious advantages over the electric field coupling.

Wireless charging technology is developing rapidly in recent years, however, it has encountered many technical problems, such as low charging efficiency, high cost, and short effective charging distance, which restricts the usage scenarios and range of application of wireless charging.

Therefore, in order to improve the wireless charging efficiency and reduce or eliminate the influence of the electromagnetic field on the mobile phone during wireless charging, a method commonly used is to shield the battery by using a shielding sheet, and the shielding sheet functions to isolate electromagnetic waves and prevent materials such as metal from absorbing the electromagnetic waves emitted from the transmitting terminal device, and generate a magnetic field in the opposite direction.

If an electromagnetic shielding sheet is not provided in the wireless charging receiving end of the mobile phone, the wireless charging device cannot complete the charging task in a short distance. Taking a smart phone as an example, due to the special structure of the mobile phone, a battery must be installed in the mobile phone. When the magnetic field emitted by the transmitting coil passes through the battery, the metal in the battery will generate an induced current, which is usually referred to as "eddy current". The eddy current generates a magnetic field opposite to the direction of the magnetic field generated by the transmitting coil, and the opposite magnetic field and the magnetic field formed by the transmitting coil may cancel each other, so that the induced voltage received by the receiving coil drops; and the eddy current is converted into heat, causing the temperature of the mobile phone battery to rise, and thus leading to a harmful effect. Therefore, in order to maintain a wireless charging for the mobile phone in a safe and effective way, a device for isolating the metal in the battery must be disposed between a receiving coil and the mobile phone battery, so as to block the magnetic line of force, and prevent the magnetic line of force from reaching the battery.

In addition, similar to wireless charging, NFC also requires the use of a magnetic shielding sheet, but the magnetic shielding sheet used in NFC operates at a frequency different from the frequency at which the magnetic shielding sheet used in the wireless charging operates. Due to the fact that the conventional magnetic shielding material only has an inhibitory effect on electromagnetic interference in a certain frequency band, and that it cannot yield a good electromagnetic shielding effect in a wider range, when a magnetic shielding sheet, formed of a certain magnetic material, is used in the mobile phone, it is often the case that the wireless charging or NFC are poorly applied.

Therefore, there is an urgent need for a shielding sheet, capable of improving both wireless charging efficiency and NFC applications, and a coil module comprising the same.

BRIEF SUMMARY OF THE INVENTION

For solving the foregoing problems in the prior art, the present invention provides a shielding sheet having the advantages of improving the wireless charging efficiency and meeting the requirements for NFC applications, such that the performance of the coil module can be further optimized.

In order to achieve the above-mentioned purposes, the present invention adopts the following technical solutions. A high-performance shielding sheet, including at least one sheet, wherein the sheet includes at least one shielding layer formed of a soft magnetic material, and the shielding layer is a layer with low coercive force and low remanence; and at least one adhesive layer disposed on at least one side of the shielding layer; wherein the shielding layer includes a plurality of graphical slits, and the plurality of graphical slits divide the shielding layer into a plurality of graphical fragments; wherein the plurality of graphical slits are filled with the adhesive layer, enabling the plurality of graphical fragments to be separated from each other and have a good insulation property.

Preferably, the sheet includes 1 to 12 shielding layers. Preferably, two adjacent shielding layers are bonded together through the adhesive layer. Preferably, the plurality of graphical slits are ordered longitudinal slits; and/or ordered transverse slits; and/or oblique unidirectional slits. Preferably, the graphics of the fragments are regular graphics and/or irregular graphics, and the regular graphics are selected from the group consisting of a rectangle, a circle and a diamond. Preferably, a size of the graphics of the fragments is in the range of 0.1 mm to 3 mm. Preferably, a size of the graphics of the fragments is in the range of 0.4 mm to 2 mm. Preferably, each of the plurality of graphical slits has a width in the range of 2 μm to 80 μm. Preferably, each of the plurality of graphical slits has a width in the range of 5 μm to 35 μm. Preferably, the shielding layer is selected from the group consisting of an amorphous/nanocrystalline shielding layer, a ferrite shielding layer, and an EMI wave-absorbing material shielding layer, or a combination thereof.

Preferably, the sheet includes: at least one amorphous/nanocrystalline shielding layer and at least one EMI wave-absorbing material shielding layer. Preferably, the shielding layer has a magnetic conductivity in the range of 220 to 10,000. Preferably, the shielding layer has a magnetic conductivity in the range of 300 to 2500. Preferably, the sheet forms a lamination structure, and the lamination structure is formed by laminating 1 to 12 layers of the sheets. Preferably, the lamination structure includes one to twelve layers of sheets formed of the amorphous/nanocrystalline shielding layer, wherein the lamination structure has a coercive force in the range of 5 A/m to 80 A/m, and has a remanence in the range of 3 mT to 140 mT in a working frequency from 30 KHz to 1 MHz.

A preparation method for the above-mentioned high-performance shielding sheet is provided, the preparation method includes steps of Step S1: heat treatment, including a plurality of soft magnetic material strips which are slit and wound are placed in a heat treatment furnace for heat treatment; Step S2: composite lamination, including a first lamination adhesive is pasted onto a first surface of a first soft magnetic material strip, so as to form a single layer of the soft magnetic material strip; a second lamination adhesive is pasted onto a second surface of the first soft magnetic material strip; the other side of the second lamination adhesive is pasted with a second soft magnetic material strip having been subjected to the heat treatment; and the above steps are repeated until a soft magnetic material strip layer, having a lamination structure consisting of at least two layers of soft magnetic material strips, is formed; and Step S3: graphical processing, including implementing surface graphical processing on the single layer structure or the lamination structure obtained in Step 2, and finally a sheet is obtained.

Preferably, in Step S1, the heat treatment is performed in the presence of magnetic field or in the absence of magnetic field. Preferably, the graphical processing in Step S3 includes steps of: forming a plurality of veins on the surface of the soft magnetic material strips by using a line pressing method; increasing the width of the slits formed by the plurality of veins by using a point contact method. Preferably, the point contact method is to form a blast point in a middle of the veins or in a vertex of the graphics formed by the veins or within an interior of the graphics formed by the veins.

Preferably, the plurality of veins are ordered longitudinal veins; and/or ordered transverse veins; and/or oblique unidirectional veins. Preferably, the graphics formed by the veins are regular graphics and/or irregular graphics, and the regular graphics are selected from the group consisting of a rectangle, a circle and a diamond. Preferably, a size of the graphics is in the range of 0.1 mm to 3 mm. Preferably, a size of the graphics is in the range of 0.4 mm to 2 mm. Preferably, each of the plurality of graphical slits has a width in the range of 2 μm to 80 μm. Preferably, each of the plurality of graphical slits has a width in the range of 5 μm to 35 μm. Preferably, the line pressing method uses a line disposed on a conveyor belt; or a regular or irregular graphics formed by line segments; or lines woven into the graphics.

A preparation method for the EMI wave-absorbing material shielding layer is provided, wherein the preparation method includes steps of: grinding magnetic particles into magnetic powder; the magnetic powder and a resin binder being uniformly mixed in a certain ratio, and the obtained mixture being coated and dried to obtain a rolled EMI wave-absorbing material; forming the EMI wave-absorbing material with a certain thickness by lamination process; and die-cutting the EMI wave-absorbing material, so as to form the EMI wave-absorbing material shielding layer.

Preferably, the grinding process includes: placing a certain amount of magnetic particles in a container; placing grinding balls of three different diameters in the container; adding a certain amount of ethanol to the container; and grinding the mixture for a certain period of time to obtain the magnetic powder. Preferably, the preparation method for the resin binder includes dissolving any one selected from the group consisting of an epoxy resin, a phenol resin, a polyurethane, a methyl methacrylate and a methacrylic acid, or a combination of at least two thereof, in a solvent of N-methylpyrrolidone or ethanol.

A coil module is provided, wherein the coil module includes the above-mentioned high-performance shielding sheet, and further includes a coil and a cooling fin, wherein the coil is attached to an upper surface of the shielding sheet, and the cooling fin is attached to an lower surface of the shielding sheet; wherein the coil has a coil width in the range of 0.5 mm to 3 mm, and has a coil pitch in the range of 0.02 mm to 0.1 mm.

Preferably, the coil module is used for near field communication, and the coil has a coil width in the range of 0.5 mm to 1.5 mm, and has a coil pitch in the range of 0.02 mm to 0.1 mm. Preferably, the coil module is used for wireless charging, and the coil has a coil width in the range of 1 mm and 3 mm, and has a coil pitch in the range of 0.02 mm to 0.1 mm. Preferably, the cooling fin is selected from the group consisting of a graphite sheet, a ceramic sheet.

By adopting the above-mentioned technical solutions, the present invention has the following advantageous technical effects over the prior art. A high-performance shielding sheet and a coil module thereof is provided, wherein the shielding sheet consists of at least one shielding layer with low coercive force and low remanence, which may induce and restrict more magnetic lines of force to pass, thereby improving the electric charging conversion rate and increasing the charging efficiency; by adopting the shielding layer with low coercive force and low remanence, transmission loss may be reduced, and the uniformity of the electromagnetic wave transmission medium may be increased; and the coil module uses a shielding layer with low coercive force and low remanence and a coil having a width and a pitch in a certain range, which may help to improve wireless charging efficiency without affecting the application of near field communication.

BRIEF DESCRIPTION OF THE SEVERAL VIEWS OF THE DRAWINGS

The accompanying drawings, together with the specification, illustrate exemplary embodiments of the present disclosure, and, together with the description, serve to explain the principles of the present invention.

DETAILED DESCRIPTION OF THE INVENTION

Figure 1:
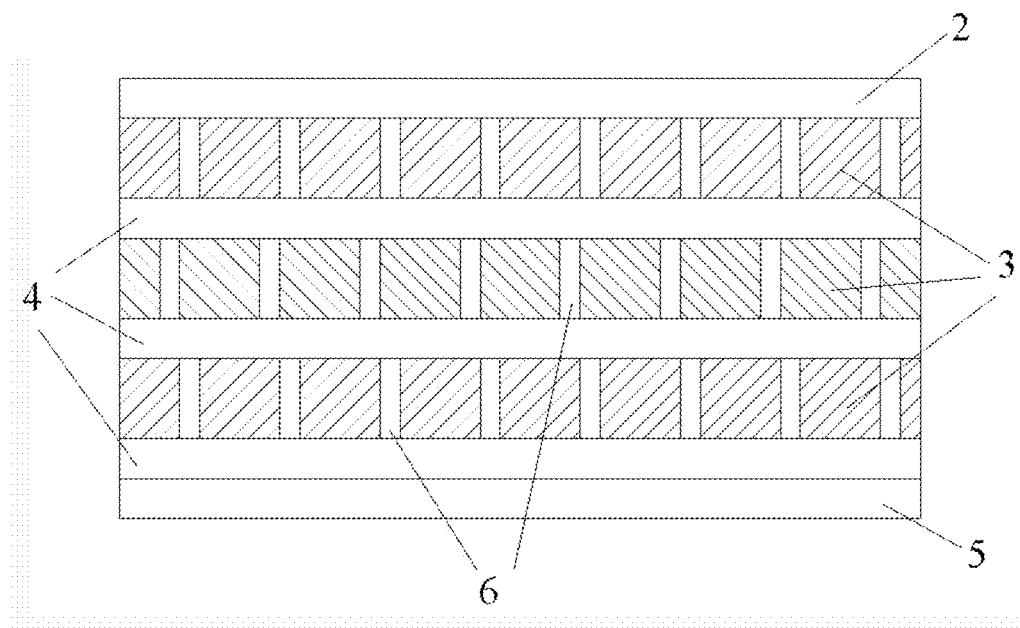
FIG. 1 is a schematic diagram of a surface treatment process according to the present invention.
Figure 2:
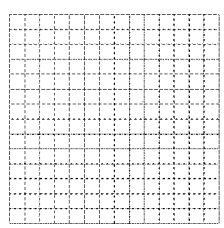
FIGS. 2(a) to 2(e) are schematic diagrams of different graphical structures according to the present invention.
Figure 2:
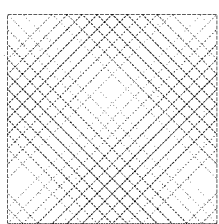
Figure 2:
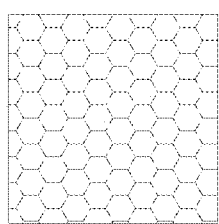
Figure 2:
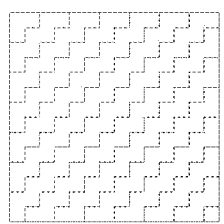
Figure 2:
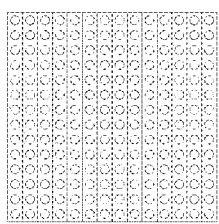

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the term "plurality" means a number greater than one.

Hereinafter, certain exemplary embodiments according to the present disclosure will be described with reference to the accompanying drawings.

Example 1

This example is an illustrative example of a high-performance shielding sheet according to the present invention.

A high-performance shielding sheet, including at least one sheet, wherein the sheet is a lamination structure and includes at least one shielding layer formed of a soft magnetic material, and the shielding layer is a layer with low coercive force and low remanence; and at least one adhesive layer adhered to at least one side of the shielding layer.

Specifically, as shown in FIG. 1, the shielding sheet 1 includes at least a high temperature resistant polyester film (PET film) 2, 3 shielding layers composed of a plurality of fragments 3 and a plurality of slits 6, an adhesive layer composed of three layers of double-sided adhesive tapes 4 and an adhesive protective film 5. The adhesive layer formed of the double-sided adhesive tape is adhered to a lower layer of each of the shielding layers, the adhesive protective film 5 is adhered to a lower layer of the lowermost adhesive layer composed of the double-sided adhesive tape 4 and the PET film 2 is attached to an upper layer of the uppermost shielding layer, and the two adjacent shielding layers are connected to each other by the adhesive layer.

In each of the shielding layers, a plurality of fragments 3, into which the shielding sheet are divided, are uniformly distributed by the plurality of slits, and each of the plurality of slits 6 is arranged between two adjacent fragments 3, and the plurality of slits 6 are filled with adhesive into which the adhesive layer penetrates.

The plurality of slits are one selected from the group consisting of ordered longitudinal slits, ordered transverse slits, and oblique unidirectional slits, or a combination of at least two thereof. Graphics of the fragments 3 are regular graphics and/or irregular graphics, and the regular graphics include, but are not limited to, a rectangle, a circle, and a diamond.

A size of the graphics of the fragments 3 (the length of each side of the graphics) is in the range of 0.1 mm to 3 mm, preferably, in the range of 0.4 mm to 2 mm.

Each of the plurality of slits 6 has a width in the range of 2 μm to 80 μm, preferably, in the range of 5 μm to 35 μm.

Each of the shielding layers has a magnetic conductivity in the range of 220 to 10,000, preferably, in the range of 300 to 2500.

The soft magnetic material used in the present invention includes an amorphous/nanocrystalline shielding layer, a ferrite shielding layer, and an EMI wave-absorbing material shielding layer.

In the present invention, the shielding sheet usually includes 1 to 12 shielding layers, wherein the shielding layer may be only the amorphous/nanocrystalline shielding layer, or a combination of the amorphous/nanocrystalline shielding layer and the EMI wave-absorbing material shielding layer.

When obtained by the lamination of the amorphous/nanocrystalline shielding layer and the EMI wave-absorbing material shielding layer, the shielding sheet 1 includes at least one amorphous/nanocrystalline shielding layer and one EMI wave-absorbing material shielding layer.

Furthermore, the shielding sheet 1 includes at least one amorphous/nanocrystalline shielding layer and one EMI wave-absorbing material shielding layer, and the EMI wave-absorbing material shielding layer is located at the uppermost of all of the amorphous/nanocrystalline shielding layers or at the lowermost of all of the amorphous/nanocrystalline shielding layers.

Example 2

The example relates to a preparation method for the shielding sheet.

In this example, amorphous/nanocrystalline material is adopted as the soft magnetic material for the preparation of a high-performance shielding sheet, and the preparation method includes the steps of:

Step S1: Heat Treatment specifically, a plurality of amorphous/nanocrystalline strips, after performing slitting and winding, are placed in a heat treatment furnace for heat treatment in the presence of magnetic field or in the absence of magnetic field.

Step S2: Composite Lamination specifically, a first lamination adhesive is pasted onto one side of a first amorphous/nanocrystalline strip having been subjected to heat treatment by using a roll-to-roll pasting method, and the other side of the first amorphous/nanocrystalline strip is an exposed surface, so as to form a single layer of amorphous/nanocrystalline strip lamination with one side exposed;

a second lamination adhesive is pasted onto the exposed side of the first amorphous/nanocrystalline strip;

the other side of the second lamination adhesive is pasted onto a second amorphous/nanocrystalline strip having been subjected to the heat treatment;

and the above steps are repeated until a amorphous/nanocrystalline strip lamination, having a lamination structure consisting of at least two layers of amorphous/nanocrystalline strips, is formed;

And Step S3: Graphical Processing specifically, carrying out surface graphical processing on the single layer structure or a lamination structure obtained in Step 2, and finally an amorphous/nanocrystalline shielding layer or an amorphous/nanocrystalline sheet is obtained.

The graphical processing method in Step S3 includes the steps of:

forming a plurality of veins on the surface of the amorphous/nanocrystalline strips by using a line pressing method;

then increasing the width of the slits formed by the plurality of veins by using a point contact method.

The line used in the line pressing method includes but is not limited to a line disposed on a conveyor belt, a regular or irregular graphics formed by line segments, or a line woven into the graphics.

As shown in FIGS. 2(a) to 2(e), the veins are any one of the veins selected from ordered longitudinal veins, ordered traverse veins, and oblique unidirectional veins, or a combination of at least two thereof. The plurality of veins form various regular or irregular graphics, such as square in FIG. 2(a), diamond in FIG. 2(b), hexagon in FIG. 2(c), wave in FIG. 2(d) and circle in FIG. 2(e). The size of graphics (length and width) is in the range of 0.1 mm to 3 mm, preferably, in the range of 0.4 mm to 2 mm.

Figure 3:
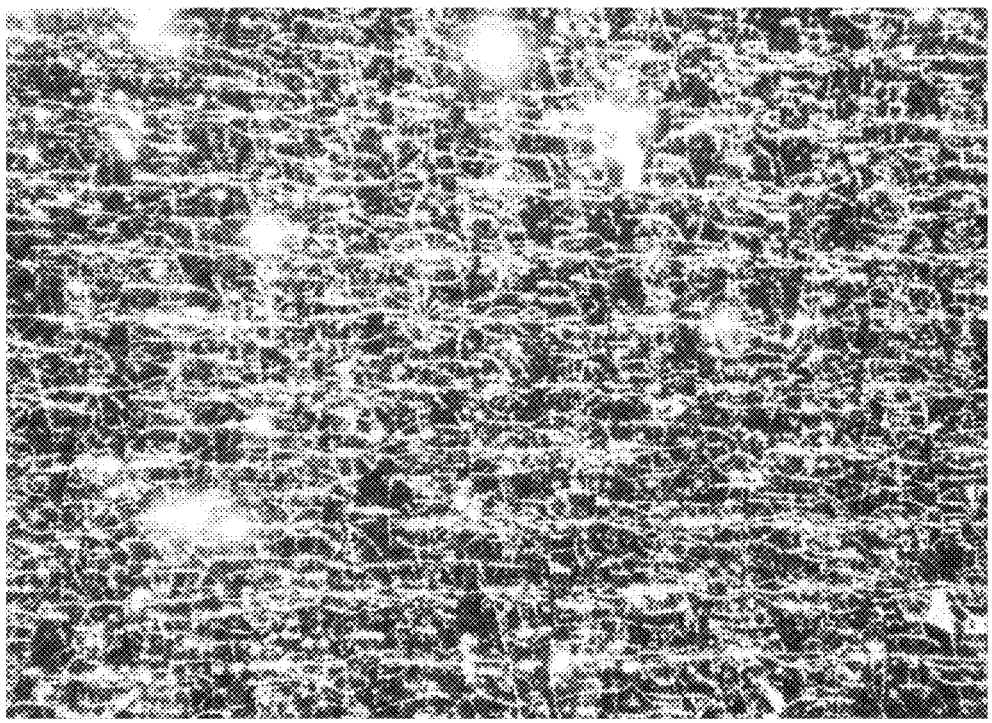
FIGS. 3(a) to 3(c) are images showing the surface microstructure of shielding layers of different magnetic conductivities prepared by different processes of the present invention.
Figure 3:
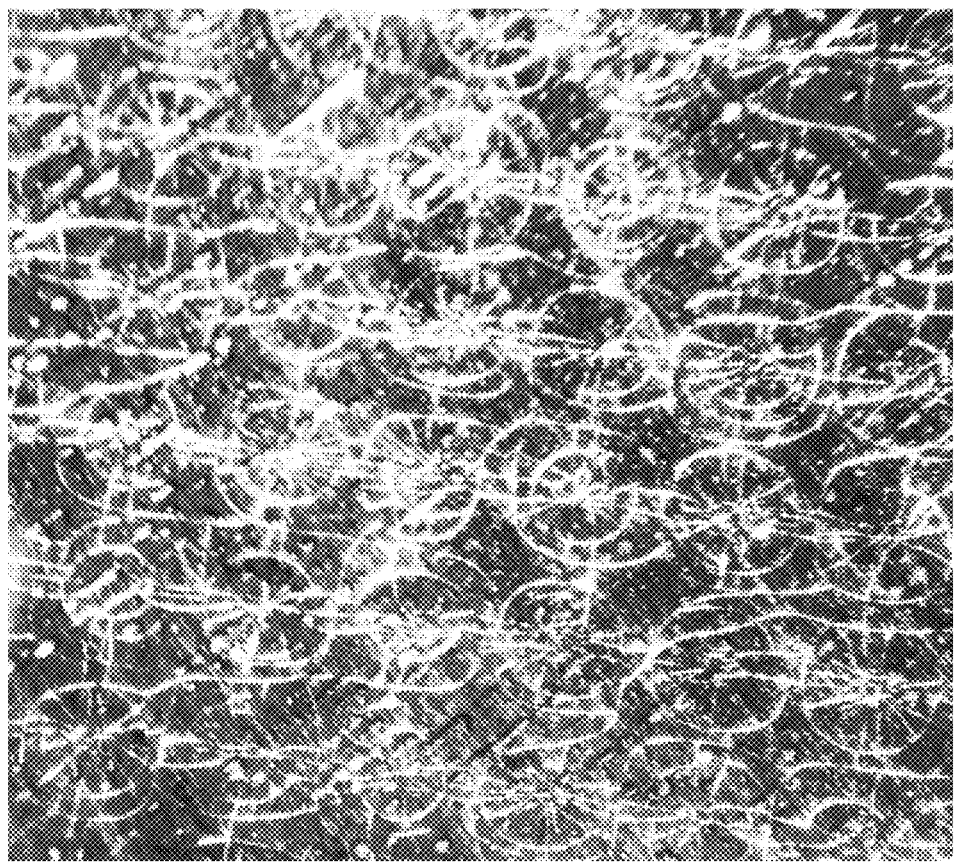
Figure 3:
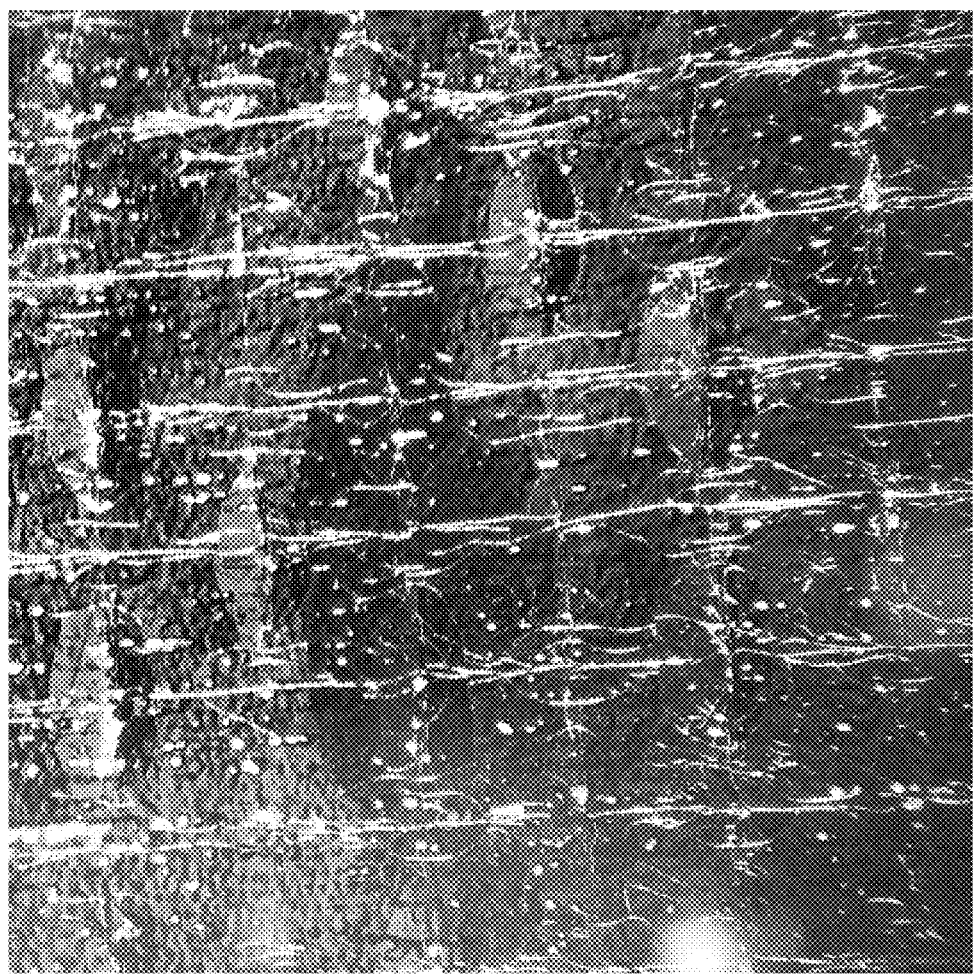

As shown in FIGS. 3(a) to 3(c), the point contact method is to form a blast point in a middle of the veins or in a vertex of the graphics formed by the veins or at an interior of the graphics formed by the veins, such that the width between the veins can be increased. Wherein, each of the plurality of slits 6 has a width in the range of 2 µm to 80 µm, preferably, in the range of 5 µm to 35 µm.

After the slits become wider, the success rate of the adhesive filling into the slits is improved, the resistivity of the shielding layer or the shielding sheet can be increased, and the eddy current loss can be reduced thus, the shielding effect can be improved.

Figure 4:
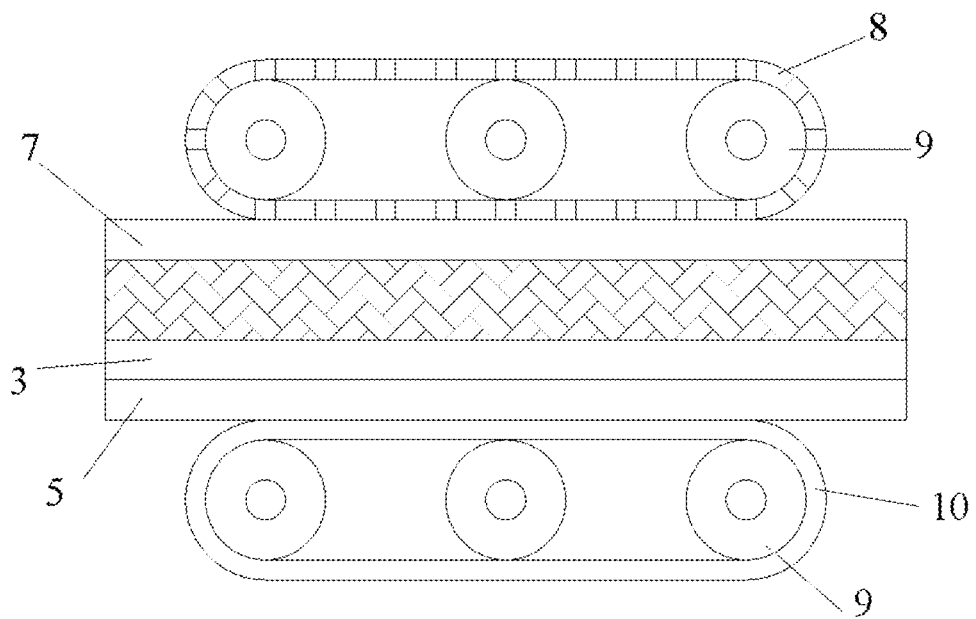
FIG. 4 is a schematic diagram showing a lamination structure of an exemplary embodiment of a high-performance shielding sheet according to the present invention; and, FIG. 5 is a cross-sectional view of an illustrative embodiment of a coil module according to the present invention.

Specifically, in this embodiment, the line pressing method refers to a wire crawler rolling process. As shown in FIG. 4, the release film 7 is used to protect the exposed surface of the shielding layer or a plurality of shielding layers having protective films thereon, and the adhesive protective film 5 is used to protect the exposed surface of the double-sided adhesive tape 3; the release film 7 and the adhesive protective film 5 are disposed between the wire crawler 8 and the conveyor belt 10, with the release film 7 facing upwards, and the adhesive protective film 5 facing downwards; assigning a preset pressure value to the wire crawler 8 by a vertical transmission shaft, and the exposed surface of the shielding layer is pressed into fragments (i.e., graphics) of a specified size and grooves (slits) of a specified depth and width by the conveying rollers 9 in a continuous rolling manner using wires of different apertures and wire diameters; then a blast point is formed in a vertex of the fragments or at an interior of the graphics by bumps in wire joints, such that the slits may become wider, and the adhesive may be easily filled into the slits. A plurality of single-layer amorphous/nanocrystalline shielding layers, after being subjected to graphic processing, are superposed to obtain a shielding sheet. In this embodiment, 1 to 12 single-layer amorphous/nanocrystalline shielding layers are disposed as mutually superposed layers, such that an amorphous/nanocrystalline shielding sheet of a lamination structure is formed.

The amorphous/nanocrystalline shielding layer prepared by the above method is detected and its parameters are as follows:

the shielding layer has a coercive force in the range of 8 A/m to 65 A/m, and has a remanence in the range of 5 mT-120 mT, and has a magnetic conductivity in the range of 220 to 5000 when operating at a frequency in the range of 100 KHz to 1 MHz.

Furthermore, the shielding sheet 1 may be a lamination structure formed of a plurality of sheets, for example, 1 to 12 amorphous/nanocrystalline sheets (the number of laminations of each sheet may be the same or different).

The shielding sheet of the lamination structure is detected and its parameters are as follows:

the shielding layer of the lamination structure has a coercive force in the range of 5 A/m to 80 A/m, and has a remanence in the range of 3 mT-140 mT when operating at a frequency in the range of 30 KHz to 120 MHz.

Example 3

This example relates to a preparation method for an EMI wave-absorbing material shielding layer.

The preparation method for the EMI wave-absorbing material shielding layer is as follows:

magnetic materials such as iron silicon aluminum and iron silicon chromium are pulverized using a planetary ball mill or a grinder to obtain magnetic particles;

the magnetic particles are placed in a new grinding container, and grinding balls of three different diameters (steel balls or zirconia balls) are placed in the grinding container, and a certain amount of ethanol is added to the grinding contain. The magnetic particles are ball-milled or grinded for a certain period of time until magnetic powder having a certain diameter and shape is obtained;

the dried magnetic powder is mixed with a resin binder at a ratio of 12:1 to form a uniform paste, then obtained paste is coated and dried (drying temperature is in the range of 50° C. to 160° C.) to obtain a rolled EMI wave-absorbing material;

EMI wave-absorbing material of different thicknesses is formed after performing lamination (hot pressing and cold pressing) on the rolled EMI wave-absorbing material; and the EMI wave-absorbing material is subjected to die-cutting process, so as to form the EMI wave-absorbing material shielding layer.

The preparation method for the resin binder includes dissolving any one selected from the group consisting of an epoxy resin, a phenol resin, a polyurethane, a methyl methacrylate, and a methacrylic acid, or a combination of at least two thereof, in a solvent of N-methylpyrrolidone or ethanol.

The EMI wave-absorbing material is detected and its parameters are as follows:

the EMI wave-absorbing material has a magnetic conductivity in the range of 100 to 300 when operating at a frequency in the range of 100 KHz to 200 KHz.

Example 4

The example relates to a coil module consisting of the high-performance shielding sheet prepared in example 1.

A conventional technique is to use a ferrite having a high magnetic conductivity for isolating the coil and the battery. However, based on the present invention, it is found that the charging frequency in the wireless charging standard (Qi charging standard) is in the range of 100 KHz to 200 KHz, therefore, an amorphous/nanocrystalline material instead of a ferrite material is used as the electromagnetic shielding sheet in the frequency range of 100 KHz to 200 KHz, which can exhibit a better shielding effect. Therefore, the soft magnetic material selected in the present embodiment is an amorphous/nanocrystalline material and an EMI wave-absorbing material.

Figure 5:
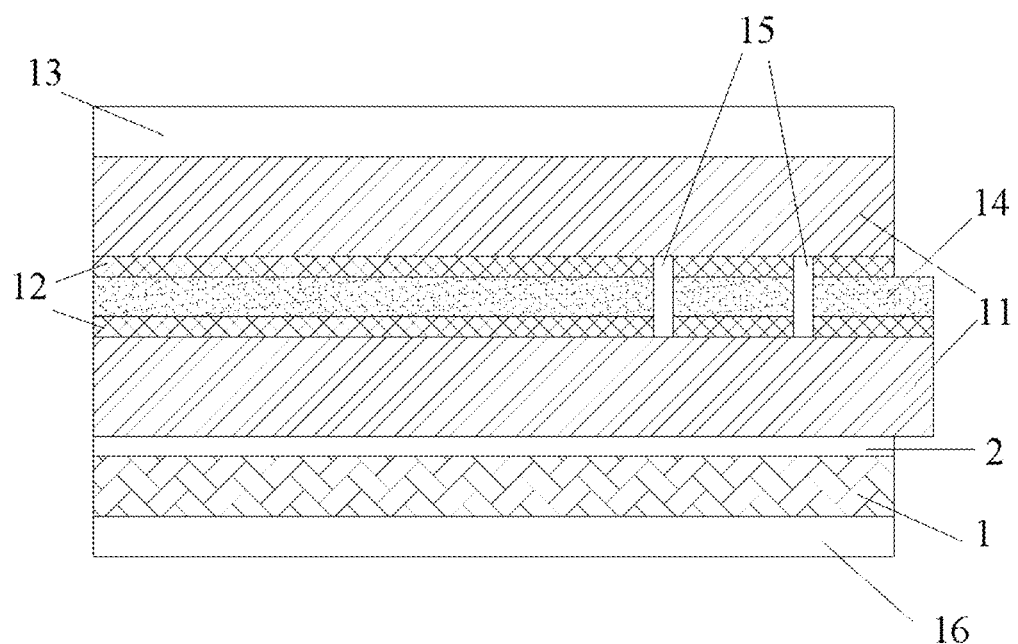

An exemplary embodiment of the coil module in the present invention is shown in FIG. 5. In this embodiment, the coil module includes a shielding sheet 1, a PET film 2, two coils 11, two hot pressing adhesives 12, a substrate-free double-sided adhesive tape 13, a substrate 14, two connecting holes for copper wires 15 and a cooling fin 16, wherein the substrate-free double-sided adhesive tape 13, the coil 11, the hot pressing adhesives 12, the substrate 14, the hot pressing adhesives 12, the coil 11, the PET film 2, the shielding sheet 1 and the cooling fin 16 are arranged in this sequence from top to bottom, and the two connecting holds for copper wires 15 connect two coils 11 disposed on an upper side and a lower side of the substrate 14.

The cooling fin 16 is composed of a heat dissipating material having high thermal conductivity, and the heat dissipating material includes but is not limited to a graphite sheet or a ceramic sheet, etc.

In the present invention, the coil has a coil width in the range of 0.5 mm to 3 mm, and has a coil pitch in the range of 0.02 mm to 0.1 mm.

The coil module used in the present invention may be a coil module for near field communication only, a coil module for wireless charging only and a coil module for both near field communication and wireless charging, depending on the application of the coil module.

When the coil module is used for near field communication, the coil 11 has a coil width in the range of 0.5 mm to 1.5 mm, and has a coil pitch in the range of 0.02 mm to 0.1 mm.

When the coil module is used for wireless charging, the coil 11 has a coil width in the range of 1 mm and 3 mm, and has a coil pitch in the range of 0.02 mm to 0.1 mm.

When the coil module is used for near field communication and wireless charging, the coil 11 has a coil width in the range of 1 mm and 1.5 mm, and has a coil pitch in the range of 0.02 mm to 0.1 mm.

Furthermore, in a preferred embodiment of the present invention, the shielding sheet 1 is composed of an amorphous/nanocrystalline shielding layer and an EMI wave-absorbing material shielding layer, wherein the amorphous/nanocrystalline shielding layer is disposed adjacent to the coil 11, and the EMI wave-absorbing material shielding layer is disposed away from the coil 11; or the amorphous/nanocrystalline shielding layer is disposed away from the coil 11, and the EMI wave-absorbing material shielding layer is disposed adjacent to the coil 11.

Example 5

This example relates to the application of the shielding sheet 1.

The shielding sheet composed of shielding layers with different magnetic parameters will affect the lowest point of the resonant frequency of the NFC function of the coil module and the conversion efficiency of wireless charging. In addition, different coil widths and coil pitches of the coil may have a significant impact on wireless charging efficiency. Therefore, this example describes the influence of the above parameters on the coil module.

Taking a shielding sheet prepared from 5 amorphous/nanocrystalline shielding layers, and a shielding sheet prepared from 3 amorphous/nanocrystalline shielding layers and one EMI wave-absorbing material shielding layer as examples, wherein examples 1-6 are shielding sheets prepared from amorphous/nanocrystalline shielding layers with different magnetic conductivities, examples 7-8 are shielding sheets prepared from amorphous/nanocrystalline shielding layers with the same magnetic conductivity, and examples 9-10 are shielding sheets prepared from amorphous/nanocrystalline shielding layers and the EMI wave-absorbing material shielding layer, and wherein the magnetic conductivity is shown in table 1-1 and table 1-2, and its parameters are detailed in table 1.

In this example, the shielding layer has a size (for the graphics) in the range of 0.4 mm to 2 mm, and has a width (for the slit) in the range of 5 μm to 35 μm.

In this example, the coil has a coil width in the range of 1 mm to 1.5 mm, and has a coil pitch in the range of 0.02 mm to 0.1 mm.

In examples 1-8, L1 is one layer closer to the coil; in example 9, EMI-1 is one layer closer to the coil; in example 10, N-1 is one layer closer to the coil.

TABLE 1-1

|  | L1, Magnetic conductivity | L2, Magnetic conductivity | L3, Magnetic conductivity | L4, Magnetic conductivity | L5, Magnetic conductivity |
|---|---|---|---|---|---|
| Example 1 | 500 | 500 | 700 | 1000 | 1400 |
| Example 2 | 500 | 700 | 1000 | 1000 | 1400 |

TABLE 1-1-continued

|  | L1, Magnetic conductivity | L2, Magnetic conductivity | L3, Magnetic conductivity | L4, Magnetic conductivity | L5, Magnetic conductivity |
|---|---|---|---|---|---|
| Example 3 | 300 | 700 | 900 | 1000 | 1400 |
| Example 4 | 700 | 700 | 1000 | 1400 | 5000 |
| Example 5 | 1400 | 1000 | 1000 | 700 | 500 |
| Example 6 | 5000 | 5000 | 1000 | 700 | 500 |
| Example 7 | 600 | 600 | 600 | 600 | 600 |
| Example 8 | 1400 | 1400 | 1400 | 1400 | 1400 |

TABLE 1-2

|  | EMI1, Magnetic conductivity | N-1, Magnetic conductivity | N-2, Magnetic conductivity | N-3, Magnetic conductivity |
|---|---|---|---|---|
| Example 9 | 260 | 600 | 600 | 600 |

|  | N-1, Magnetic conductivity | N-2, Magnetic conductivity | N-3, Magnetic conductivity | EMI1, Magnetic conductivity |
|---|---|---|---|---|
| Example 10 | 600 | 600 | 600 | 260 |

TABLE 2

|  | Coercive force (A/m) | remanence (mT) | Magnetic field strength (A/m) | Mass loss (W/g) | Inductance (H) | Element RS (mΩ) |
|---|---|---|---|---|---|---|
| Example 1 | 12.8 | 11.0 | 448 | 0.21 | 6.36 | 189 |
| Example 2 | 12.4 | 14.0 | 436 | 0.23 | 6.35 | 189 |
| Example 3 | 12.3 | 9.2 | 445 | 0.18 | 6.32 | 188 |
| Example 4 | 32.0 | 60.3 | 153 | 0.53 | 6.55 | 221 |
| Example 5 | 16.8 | 17.5 | 374 | 0.41 | 6.38 | 195 |
| Example 6 | 27.2 | 55.4 | 210 | 0.48 | 6.52 | 215 |
| Example 7 | 12.1 | 10.6 | 460 | 0.23 | 6.32 | 188 |
| Example 8 | 14.7 | 25.1 | 454 | 0.38 | 6.45 | 191 |

It can be seen from table 1-1 and table 2 that the shielding sheets of examples 1, 2 and 3, the shielding layer with low magnetic conductivity which are close to the coil and the shielding sheet composed of the magnetic conductivity layer of example 7, the coercive force, remanence, magnetic field strength, mass loss, and impedance value are basically the same, but they are superior to the shielding sheets in which the high magnetic conductivity layer is closer to the coil surface in other examples.

The charging efficiency tests are performed on Examples 1 to 8, and the results are shown in Table 3.

|  | Transmitting device (TX) | | Receiving device (RX) | | Charging efficiency (%) |
|---|---|---|---|---|---|
|  | Voltage (V) | Current (A) | Voltage (V) | Current (A) |  |
| Example1 | 12 | 1.425 | 11.92 | 1.2 | 83.65 |
| Example 2 | 12 | 1.426 | 11.92 | 1.2 | 83.59 |
| Example 3 | 12 | 1.425 | 11.92 | 1.2 | 83.65 |
| Example 4 | 12 | 1.455 | 11.92 | 1.2 | 81.92 |
| Example 5 | 12 | 1.436 | 11.92 | 1.2 | 83.01 |
| Example 6 | 12 | 1.448 | 11.92 | 1.2 | 82.32 |
| Example 7 | 12 | 1.423 | 11.92 | 1.2 | 83.77 |
| Example 8 | 12 | 1.428 | 11.92 | 1.2 | 83.47 |

It can be seen from Table 3 that Example 7 has the highest charging efficiency, and Example 1, Example 2, Example 3, and Example 8 have substantially the same charging efficiency, and Example 4 and Example 6 have the lowest charging efficiency. Judging from the above result, it is suggested that the shielding layer, closest to the coil, is low in magnetic conductivity and for the shielding sheet formed by the same magnetic conductivity shielding layer, the graphics size and the slit width are moderate, and the coercive force and the remanence are low, which can induce and restrict more magnetic lines of force to pass through the coil, so as to increases the electrical energy conversion rate, that is, increases the charging efficiency, and vice versa.

Near Field Communication (NFC) tests are performed on Examples 1, 3, 7, 9, and 10, and the results are shown in Table 4.

It can be seen from Table 4 that the NFC resonant frequency of the coil module composed of the two types of shielding sheets of the present invention is about 13.56 MHz, the resonant frequency is stable and the loss is relatively low, that is, the voltage standing wave is relatively low.

It can be seen that the NFC coil is close to the shielding layer with low coercive force and low remanence, which can reduce the transmission loss and improve the uniformity of the electromagnetic wave transmission medium, that is to say, reduce the sensitivity of the antenna closer to NFC.

TABLE 4

|  | Inductance of shielding sheet (μH) | Resonant frequency of shielding sheet (MHz) | VSWR of shielding sheet | Module resonant frequency (MHz) | Module VSWR |
|---|---|---|---|---|---|
| Example 1 | 6.23 | 11.54 | 1.88 | 13.492 | 1.07 |
| Example 3 | 6.25 | 11.56 | 1.87 | 13.495 | 1.05 |
| Example 7 | 6.23 | 11.74 | 1.92 | 13.617 | 1.23 |
| Example 9 | 6.13 | 11.62 | 2.01 | 13.740 | 1.30 |
| Example 10 | 6.14 | 11.53 | 1.98 | 13.560 | 1.21 |

In conclusion, the amorphous/nanocrystalline shielding sheet is preferred. The shielding layer, closer to the coil and away from the NFC antenna, has a magnetic conductivity in the range of 300 to 2500, a coercive force in the range of 8 A/m to 20 A/m, and a remanence of 5 mT to 40 mT.

The above descriptions are only the preferred embodiments of the invention, not thus limiting the embodiments and scope of the invention. Those skilled in the art should be able to realize that the schemes obtained from the content of specification and drawings of the invention are within the scope of the invention.

We claim:

1. A high-performance shielding sheet, comprising at least one sheet, wherein the sheet comprises:
   at least one shielding layer formed of a soft magnetic material, and the shielding layer is a layer with low coercive force and low remanence; and
   at least one adhesive layer disposed on at least one side of the shielding layer;

wherein the shielding layer comprises a plurality of graphical slits, and the plurality of graphical slits divide the shielding layer into a plurality of graphical fragments;

wherein the plurality of graphical slits are filled with the adhesive layer, enabling the plurality of graphical fragments to be separated from each other and have a good insulation property.

2. The high-performance shielding sheet as claimed in claim 1, wherein the sheet comprises 1 to 12 shielding layers.

3. The high-performance shielding sheet as claimed in claim 2, wherein two adjacent shielding layers are bonded together through the adhesive layer.

4. The high-performance shielding sheet as claimed in claim 1, wherein the plurality of graphical slits comprise ordered longitudinal slits, ordered transverse slits and oblique unidirectional slits.

5. The high-performance shielding sheet as claimed in claim 1, wherein the graphics of the fragments comprise regular graphics and irregular graphics, and wherein the regular graphics are selected from the group consisting of a rectangle, a circle and a diamond.

6. The high-performance shielding sheet as claimed in claim 5, wherein a size of the graphics of the fragments is in the range of 0.1 mm to 3 mm.

7. The high-performance shielding sheet as claimed in claim 6, wherein a size of the graphics of the fragments is in the range of 0.4 mm to 2 mm.

8. The high-performance shielding sheet as claimed in claim 1, wherein each of the plurality of graphical slits has a width in the range of 2 μm to 80 μm.

9. The high-performance shielding sheet as claimed in claim 8, wherein each of the plurality of graphical slits has a width in the range of 5 μm to 35 μm.

10. The high-performance shielding sheet as claimed in claim 1, wherein the shielding layer is selected from the group consisting of an amorphous/nanocrystalline shielding layer, a ferrite shielding layer, and an EMI wave-absorbing material shielding layer, or a combination thereof.

11. The high-performance shielding sheet as claimed in claim 10, wherein the sheet comprises:
at least one layer of amorphous/nanocrystalline shielding layer and at least one EMI wave-absorbing material shielding layer.

12. The high-performance shielding sheet as claimed in claim 1, wherein the shielding layer has a magnetic conductivity in the range of 220 to 10,000.

13. The high-performance shielding sheet as claimed in claim 12, wherein the shielding layer has a magnetic conductivity in the range of 300 to 2500.

14. The high-performance shielding sheet as claimed in claim 1, wherein the sheet forms a lamination structure, and the lamination structure is formed by laminating 1 to 12 layers of the sheets.

15. The high-performance shielding sheet as claimed in claim 14, wherein the lamination structure comprises one to twelve layers of sheets formed of the amorphous/nanocrystalline shielding layer, wherein the lamination structure has a coercive force in the range of 5 A/m to 80 A/m, and has a remanence in the range of 3 mT to 140 mT in a working frequency from 30 KHz to 1 MHz.

16. A preparation method for the high-performance shielding sheet as claimed in claim 1, comprising the steps of Step S1: heat treatment, comprising:
a plurality of soft magnetic material strips which are slit and wound are placed in a heat treatment furnace for heat treatment;

Step S2: composite lamination, comprising:
a first lamination adhesive is pasted onto a first surface of a first soft magnetic material strip, so as to form a single layer of the soft magnetic material strip;
a second lamination adhesive is pasted onto a second surface of the first soft magnetic material strip;
the other side of the second lamination adhesive is pasted with a second soft magnetic material strip having been subjected to the heat treatment;
and the above steps are repeated until a soft magnetic material strip layer, having a lamination structure consisting of at least two layers of soft magnetic material strips, is formed;

and Step S3: graphical processing, comprising:
performing surface graphical processing on the single layer structure or the lamination structure obtained in Step 2, and finally the high-performance shielding sheet is obtained.

17. The preparation method for the high-performance shielding sheet as claimed in claim 16, wherein in Step S1, the heat treatment is performed in the presence of magnetic field or in the absence of magnetic field.

18. The preparation method for the high-performance shielding sheet as claimed in claim 16, wherein the graphical processing in Step S3 comprises the steps of:
forming a plurality of veins on the surface of the soft magnetic material strips by using a line pressing method;
increasing the width of the slits formed by the plurality of veins by using a point contact method.

19. The preparation method for the high-performance shielding sheet as claimed in claim 18, wherein the point contact method comprises forming a blast point in a middle of the veins, in a vertex of the graphics formed by the veins and within an interior of the graphics formed by the veins.

20. The preparation method for the high-performance shielding sheet as claimed in claim 18, wherein the plurality of veins comprise ordered longitudinal veins, ordered transverse veins and oblique unidirectional veins.

21. The preparation method for the high-performance shielding sheet as claimed in claim 20, wherein the graphics formed by the veins comprise regular graphics and/or irregular graphics, and the regular graphics are selected from the group consisting of a rectangle, a circle and a diamond.

22. The preparation method for the high-performance shielding sheet as claimed in claim 21, wherein a size of the graphics is in the range of 0.1 mm to 3 mm.

23. The preparation method for the high-performance shielding sheet as claimed in claim 22, wherein a size of the graphics is in the range of 0.4 mm to 2 mm.

24. The preparation method for the high-performance shielding sheet as claimed in claim 18, each of the plurality of graphical slits has a width in the range of 2 μm to 80 μm.

25. The preparation method for the high-performance shielding sheet as claimed in claim 24, wherein each of the plurality of graphical slits has a width in the range of 5 μm to 35 μm.

26. The preparation method for the high-performance shielding sheet as claimed in claim 18, wherein the line pressing method comprises a line disposed on a conveyor belt, regular graphics formed by line segments, irregular graphics formed by line segments and lines woven into the graphics.

27. A preparation method for the EMI wave-absorbing material shielding layer as claimed in claim 11, comprising the steps of:
   grinding magnetic particles into magnetic powder;
   the magnetic powder and a resin binder being uniformly mixed in a certain ratio, and the obtained mixture being coated and dried to obtain a rolled EMI wave-absorbing material;
   forming the EMI wave-absorbing material with a certain thickness by lamination process; and
   die-cutting the EMI wave-absorbing material, so as to form the EMI wave-absorbing material shielding layer.

28. The preparation method for the shielding sheet as claimed in claim 27, wherein the grinding process comprises:
   placing a certain amount of magnetic particles in a container;
   placing grinding balls of three different diameters in the container;
   adding a certain amount of ethanol to the container; and
   grinding the mixture for a certain period of time to obtain the magnetic powder.

29. The preparation method for the shielding sheet as claimed in claim 27, wherein the preparation method for the resin binder comprises dissolving any one selected from the group consisting of an epoxy resin, a phenol resin, a polyurethane, a methyl methacrylate and a methacrylic acid, or a combination of at least two thereof, in a solvent of N-methylpyrrolidone or ethanol.

30. A coil module comprising the high-performance shielding sheet as claimed in claim 1, wherein the coil module further comprises:
   a coil and a cooling fin, wherein the coil is attached to an upper surface of the shielding sheet, and the cooling fin is attached to an lower surface of the shielding sheet;
   wherein the coil has a coil width in the range of 0.5 mm to 3 mm, and has a coil pitch in the range of 0.02 mm to 0.1 mm.

31. The coil module as claimed in claim 30, wherein the coil module is used for near field communication, and the coil has a coil width in the range of 0.5 mm to 1.5 mm, and has a coil pitch in the range of 0.02 mm to 0.1 mm.

32. The coil module as claimed in claim 30, wherein the coil module is used for wireless charging, and the coil has a coil width in the range of 1 mm and 3 mm, and has a coil pitch in the range of 0.02 mm to 0.1 mm.

33. The coil module as claimed in claim 30, wherein the cooling fin is selected from the group consisting of a graphite sheet, a ceramic sheet.

* * * * *